(12) United States Patent
Crouse

(10) Patent No.: US 7,701,025 B2
(45) Date of Patent: Apr. 20, 2010

(54) METHOD AND DEVICE FOR CONCENTRATING LIGHT IN OPTOELECTRONIC DEVICES USING RESONANT CAVITY MODES

(75) Inventor: David Crouse, New York, NY (US)

(73) Assignee: Research Foundation of the City University of New York, New York, NY (US)

( * ) Notice: Subject to any disclaimer, the term of this patent is extended or adjusted under 35 U.S.C. 154(b) by 844 days.

(21) Appl. No.: 11/422,351

(22) Filed: Jun. 6, 2006

(65) Prior Publication Data

US 2007/0278680 A1     Dec. 6, 2007

(51) Int. Cl.
    *H01L 31/0232* (2006.01)
(52) U.S. Cl. ............... 257/436; 257/434; 257/E31.121; 257/E31.124
(58) Field of Classification Search ................. 257/431, 257/434–437, E31.081, E31.082, E31.085, 257/E31.121, E31.123–E31.126
    See application file for complete search history.

(56) References Cited

U.S. PATENT DOCUMENTS

| | | | |
|---|---|---|---|
| 5,625,729 A | 4/1997 | Brown | |
| 5,973,316 A | 10/1999 | Ebbesen et al. | |
| 7,153,720 B2 * | 12/2006 | Augusto | ...................... 438/69 |

FOREIGN PATENT DOCUMENTS

WO    WO 2005/092037    10/2005

OTHER PUBLICATIONS

A. Barbara et al., "Electromagnetic Resonances of Sub-Wavelength Rectangular Metallic Gratings", *The European Physical Journal D*, 23:143-154, 2003.
A. Barbara et al., "Optical Transmission Through Subwavelength Metallic Gratings", *The American Physical Society*, 66:161403, 2002.
Cao et al., "Negative Role of Surface Plasmons in the Transmission of Metallic Gratings with Very Narrow Slits", *The American Physical Society*, 88:57403, 2002.
Crouse, David, "Numerical Modeling and Electromagnetic Resonant Modes in Complex Grating Structures and Optoelectronic Device Applications", *IEEE Transactions on Electron Devices*, 52:2365-2373, 2005.
Crouse et al., "Role of Optical and Surface Plasmon Modes in Enhanced Transmission and Applications", *Optics Express*, 13:7760-7771.

(Continued)

*Primary Examiner*—Matthew E Warren
(74) *Attorney, Agent, or Firm*—Hoffmann & Baron, LLP

(57) ABSTRACT

A grating structure for channeling and concentrating incident radiation includes a regular pattern of elements each with a metallic shell partially surrounding at least one subcavity. The subcavity is filled with a dielectric or semiconductor. Light of one or more predetermined wavelength ranges can be concentrated in the subcavity(s) and then efficiently channeled through the grooves between adjacent elements. An optoelectronic device includes the structure superposed on a substrate, which can be semiconductive, and the elements of the grating used as electrodes and adapted to allow a potential difference between adjacent (electrode) elements. The optoelectronic devices include photodetectors, e.g., metal-semiconductor-metal, pn, pin, avalanche, LEDs, IR emitting devices, and biological or chemical sensors.

23 Claims, 9 Drawing Sheets

OTHER PUBLICATIONS

Ebbesen et al., "Extraordinary Optical Transmission Through Sub-Wavelength Hole Arrays", *Nature*, 391:667-669, 1998.
Kano et al., "Surface-Plasmon Sensor for Absorption-Sensitivity Enhancement", *Applied Optics*, 33:5166-5170, 1994.
Lochbihler, Hans, "Surface Polaritons on Gold-Wire Gratings", *The American Physical Society*, 50:4795-4801, 1994.
Porto, et al., "Transmission Resonances on Metallic Gratings with Very Narrow Slits", *The American Physical Society*, 83:2845-2848.

* cited by examiner

METHOD AND DEVICE FOR CONCENTRATING LIGHT IN OPTOELECTRONIC DEVICES USING RESONANT CAVITY MODES

FIELD OF THE INVENTION

The invention relates generally to the field of optoelectronic devices and, more particularly, to optical grating structure for efficiently channeling and concentrating light in optoelectronic devices, including metal-semiconductor-metal devices, in order to optimize device performance.

BACKGROUND

In prior art metal-semiconductor-metal (MSM) detectors, as light of an energy sufficiently larger than the bandgap of the semiconductor is incident on the structure, some of the incident light impinges on the semiconductor between the electrodes and excites charge carriers, i.e., electrons and holes, in the semiconductor. The electrons are swept by the applied voltage and electric field toward positively charged electrodes. The holes are swept in the opposite direction towards the negatively charged electrodes. As the charge carriers are swept to the electrodes, or contacts, they induce a measurable electrical current in the contacts.

The speed of the MSM device is generally limited by the time necessary for charges to be swept to the electrodes. One method to increase the speed of these MSM devices has been to reduce the spacing between adjacent electrodes. The reduced spacing shortens the distance the carriers have to travel to the electrodes, therefore decreasing the transit time. The decreased transit time results in increased speed of the device. This increased speed is an advantage of MSM devices over other types of detectors. By reducing the spacing while maintaining a constant contact spacing, however, a large percentage of the surface of the device is covered with metallic reflective electrodes that reflect the incident light, resulting in lower sensitivity. Consequently, light sensitivity is sacrificed for high speed in typical MSM devices.

The multiple electrode configuration in an MSM device may form a grating-like structure. The transmission of light through closely spaced gratings has been a subject studied by researchers in the past. In particular, surface plasmons (SPs) and other optical modes and electromagnetic resonances (ER) exhibiting dramatic optical behavior have been observed and analyzed in lamellar gratings and other periodic compound grating structures. Research into the phenomenon of "anomalous" transmission and electromagnetic resonances in periodic structures increased after Ebbesen et al. reported that a two-dimensional array of holes can transmit a higher proportion of light at certain wavelengths and angles of incident than the ratio of the area of the holes relative to the total area of the film, in Ebbesen, T. W., et al., "Extraordinary Optical Transmission Through Sub-Wavelength Hole Arrays," *Nature,* 391: pp. 667-669 (1998). In other words, the incident light seems to be "channeled" through the holes. Anomalous transmission has also been observed in ID periodic grating structures, for example, in Lockbihler, H., "Surface Polaritons on Gold-Wire Gratings," *Physical Review B,* 50(7): p. 4795 (1994). These and other researchers have been primarily interested in the physical mechanisms of anomalous transmission, without examining the practical applications of surface plasmons to electro-optical devices, for example, with a few noteworthy exceptions.

For example, U.S. Pat. No. 5,973,326 to Ebbesen, et al. discloses an array of subwavelength apertures in a metallic film or thin metal plate for enhanced light transmission by coupling to an SP mode, where the period of the array is chosen to enhance transmission within a particular wavelength range. The array may be used to filter and collect light for photolithographic applications.

In another example, U.S. Pat. No. 5,625,729 to Brown discloses an optoelectronic device for resonantly coupling incident radiation to a local surface plasmon wave. The device includes a plurality of substantially planar and regularly spaced low-profile electrodes, which forms a grating, on a semiconductor substrate to resonantly couple a surface plasmon mode propagating along the grating and the substrate (horizontal SP mode).

The Brown patent, therefore, extends the know coupling effect of horizontal SPs on flat grated interfaces to the periodic metal gratings that make up a conventional MSM photodetector. However, the MSM photodetector of the Brown patent teaches use of only the classical lamellar grating.

The issue of which electromagnetic modes are responsible for peaks in transmittance through various classical one-dimensional optical gratings has been a topic of recent research and debate. Examples of different modes that have been identified and investigated include horizontal surface plasmon (HSP) modes. Wood-Rayleigh (WR) anomalies (i.e., the onset of a diffracted mode), diffracted modes and cavity modes (CM), sometimes referred to alternately as waveguide modes, and vertical surface resonances (VSRs), also referred to as vertical surface plasmon (VSP) modes.

In particular, in Porto, et al., "Transmission Resonances on Metallic Gratings with Very Narrow Slits," *Phys. Rev. Lett.* 83, pp. 2845-2848 (1999), the authors proposed two separate mechanisms they believed could be responsible for enhanced transmission through metallic slit array: coupled HSPs on the top and bottom interface; and cavity modes located in the slits. A somewhat opposing view is presented in Cao, et al., "Negative Role of Surface Plasmons in the Transmission of Metallic Gratings with Very Narrow Slits," *Phys. Rev. Lett.* 88, 057403(1)-057403(4) (2002). Both the Cao, et al. and Porto et al. references assert that CMs produce enhanced transmission. However, contrary to the Porto et al. reference, the Cao et al. reference states that excitation of HSPs invariably leads to a minimum rather than a maximum in transmittance.

Consequently, there is a need, which is not provided for in the prior art, for more efficient use of optimized optical gratings to channel and concentrate optical radiation for use in various optoelectronic devices.

SUMMARY OF THE INVENTION

The present invention relates to light-channeling and concentrating grating structures and various optoelectronic devices incorporating such structures. The invention further relates to efficient optoelectronic devices which include the light-channeling and concentrating structures adapted as electrode structures.

In particular, the present invention relates to an optoelectronic device including a substrate, and an electrode structure in superposed relationship with the substrate for concentrating and channeling at least a portion of incident electromagnetic radiation. The electrode structure includes a plurality of electrode elements arranged in a substantially regular pattern and a plurality of grooves between adjacent electrode elements. Each electrode element includes at least one subcavity filled with one of a dielectric and a semiconductive material and an electrode shell at least partially surrounding the at least one subcavity. The electrode elements are adapted to allow a potential difference between adjacent electrode elements. The electrode structure initially concentrates at least a portion of incident electromagnetic radiation in the at least one subcavity and subsequently channels the portion of incident electromagnetic radiation into the plurality of grooves.

The present invention also relates to a grating structure for concentrating and channeling at least a portion of incident electromagnetic radiation, which includes a structure having a plurality of elements arranged in a substantially regular pattern. Each element includes at least one subcavity filled with one of a dielectric and a semiconductive material, and a metallic shell with a thickness greater than 100 nanometers at least partially surrounding the at least one subcavity. The structure also includes a plurality of grooves between adjacent elements whereby the grating structure initially concentrates at least the portion of incident electromagnetic radiation in the subcavity(s) and channels it into the plurality of grooves.

The present invention also relates to a grating structure for concentrating and channeling at least a portion of incident electromagnetic radiation, which includes a structure having a plurality of elements arranged in a substantially regular pattern. Each element includes at least one subcavity filled with a semiconductive material, and a metallic shell at least partially surrounding the at least one subcavity. The structure also includes a plurality of grooves between adjacent elements whereby the grating structure initially concentrates at least the portion of incident electromagnetic radiation in the subcavity(s) and channels it into the plurality of grooves.

As a result, the present invention provides a light-concentrating and light-channeling structure that can serve as an electrode structure which is integrated into an optoelectronic device for optimizing device performance.

These and other objects, features, and advantages of this invention will become apparent from the following detailed description of illustrative embodiments thereof, which is to be read in connection with the accompanying drawings.

DETAILED DESCRIPTION OF THE PREFERRED EMBODIMENTS

The device formed in accordance with the present invention includes grating structures that include subcavities in the metal wires or electrodes of the grating. The grating structures with subcavities can be tailored to efficiently channel and concentrate optical radiation for use in various optoelectronic devices and applications. Such device include but are not limited to light emitting diodes (LEDs), infrared (IR) light emitters, metal-semiconductor-metal (MSM) photodetectors, MSM photodetectors fabricated on silicon-on-insulator substrates, avalanche photodetectors, pn and pin photodetectors.

It should be noted that the term "electrode structure" is used interchangeably with the phrase "grating structure" when the elements of the grating structure are adapted for use as electrodes, particularly for use in optoelectronic devices. However, it is understood that the grating structure of the present invention is not limited in scope to use as an electrode structure. Those skilled in the art will appreciate, for example, that the grating structures of the present invention can also be used as polarizers and polarizing beam-splitters.

Figure 1:
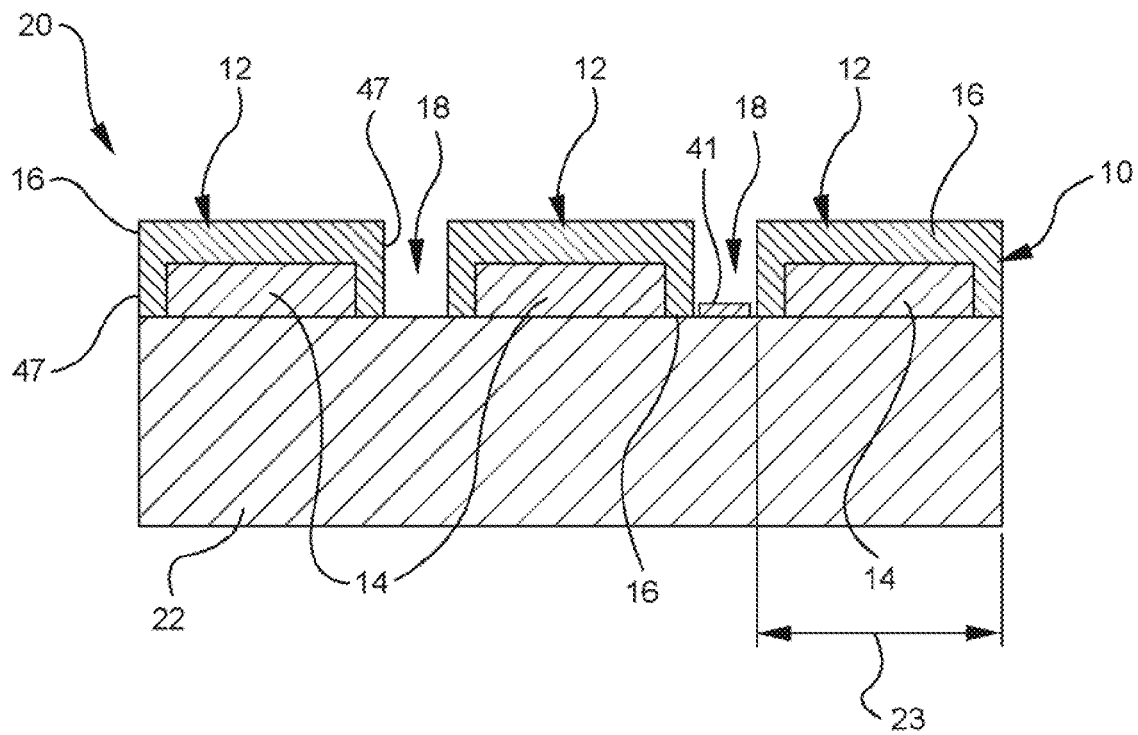
FIG. 1 is a pictorial representation of a cross-section through a portion of an embodiment of a light-channeling and concentrating electrode structure and an MSM detector formed in accordance with the present invention.

Referring to FIG. 1, a grating structure 10 of the present invention for concentrating (or localizing) and channeling a portion of incident electromagnetic radiation (light energy, e.g.) includes a plurality of electrode elements 12, preferably arranged in a regular pattern. Each electrode element 12 includes at least one subcavity 14 and an electrode shell 16 that partially surrounds the subcavity 14. Each subcavity 14 is filled with either a dielectric or a semiconductor.

The plurality of electrode elements 12 are adapted to allow a potential difference between adjacent electrode elements 12. In addition, the structure 10 includes a plurality of grooves 18 between adjacent electrode elements. The portion of the incident electromagnetic radiation is preferably initially concentrated in the at least one subcavity 14.

Preferably, the portion of the incident electromagnetic radiation that is channeled into and concentrated within the structure 10 lies within a predetermined wavelength range. One skilled in the art will appreciate that the predetermined wavelength range is obtained by appropriate choice of periodicity of the grating structure 10. Therefore, the structure 10 can selectively concentrate and channel that portion of the incident radiation that falls within a particular wavelength range.

The plurality of electrodes preferably refers to at least two electrodes and are not theoretically limited to any maximum number.

Still referring to FIG. 1, one embodiment of an optoelectronic device 20 of the present invention is a photon detection device that includes the grating structure 10 and a substrate 22, wherein the grating structure 10 is in superposed relationship with the substrate 22. The substrate 22 includes a semiconductor material. The optoelectronic device 20 thus formed functions as an efficient metal-semiconductor-metal (MSM) photodetector.

The semiconductor material of the substrate 22 of an MSM device formed in accordance with the present invention can include, but is not limited to, the following: elemental IV semiconductors, such as silicon (Si); III-V semiconductors, such as gallium arsenide (GaAs) and indium phosphide (InP), and III-V ternary compound semiconductors, such as aluminum gallium arsenide (AlGaAs) and indium gallium arsenide (InGaAs); and II-VI semiconductors, such as mercury cadmium telluride (HgCdTe).

In another embodiment, the substrate 22 includes a silicon-on-insulator structure.

Most preferably, the substrate includes mercury cadmium telluride, indium gallium arsenide, silicon, or a silicon-on-insulator structure.

The electrode structure and shell geometry can be formed by any methods known to those skilled in the art, such as those using photolithography or electron beam lithography.

The electrode shell of the present invention can include any electrically conductive material known to those skilled in the art for use as an electrode. Preferably, the electrode shell includes a metal for example, gold, copper, or aluminum. In addition, a potential difference is applied between adjacent electrode shells, for example, by applying a positive voltage to every other shell and a negative voltage to the remaining shells using an interdigitated electrode scheme which those skilled in the art will recognize as forming back-to-back Schottky contacts when deposited on the surface of a semiconductor substrate.

Figure 2:
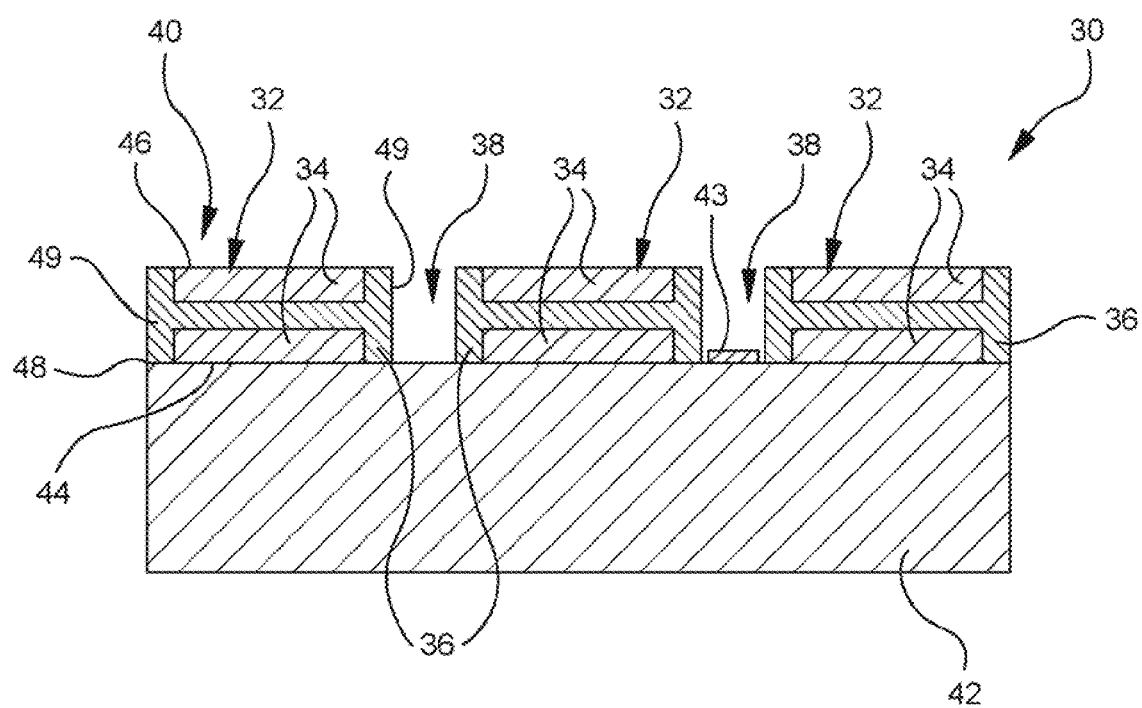
FIG. 2 is a pictorial representation of a cross-section through a portion of another embodiment of a light-channeling and concentrating electrode structure and MSM detector formed in accordance with the present invention.

The particular shape and arrangement of the electrode shell and the at least one subcavity in each electrode element are preferably chosen to selectively eliminate or minimize the role of horizontal surface plasmons (HSPs) while leaving diffracted modes. Wood-Rayleigh (WR) modes and cavity modes (CM) substantially unchanged. FIG. 1, as well as FIG. 2, show examples of particular shapes of the electrode shell that eliminate undesirable horizontal surface plasmons (HSPs) that would otherwise form in prior art MSM structures at the metal/semiconductor and metal/air interfaces. In particular, HSPs at the metal/semiconductor interface have been shown in prior art devices to produce large absorption in the metal electrodes or wires, peaks in the reflectance and high field intensities in the semiconductor directly under the contact. Because the static electric field produced by an applied bias is small in the region beneath the contact, photogenerated carriers at these locations will take a long time to drift to their respective contacts, undesirably resulting in increased detector response time.

The spacing between the electrode elements of the present invention, i.e., the width of the grooves, may be one predetermined width, or may be patterned, for example, to regularly alternate between two different widths. One skilled in the art will appreciate that providing two periodic gratings in this manner offers the ability to tailor the device to optimize transmission of two different wavelength ranges, and, therefore, to provide a dual wavelength photodetector. Likewise, all electrode elements can be of the same height, or alternating elements can, for example, be of two different heights.

Each subcavity of the electrode elements of the present invention is filled with either a dielectric material which can be air, or a semiconductor. In one embodiment, a different dielectric or semiconductor occupies the grooves than occupies the subcavities.

In another embodiment, the subcavity(s) of the present invention is filled with a dielectric material. Most preferably, the dielectric is silicon dioxide, silicon nitride, or polyimide.

In yet another embodiment, the subcavity(s) of the present invention is filled with a semiconductive material. The semiconductive material can include, but is not limited to, the following: elemental IV semiconductors, such as silicon (Si); III-V semiconductors, such as gallium arsenide (GaAs) and indium phosphide (InP), and III-V ternary compound semiconductors, such as aluminum gallium arsenide (AlGaAs) and indium gallium arsenide (InGaAs); and II-VI semiconductors, such as mercury cadmium telluride (HgCdTe).

In one embodiment, all subcavities are filled with the same dielectric or semiconductive material. Other variations are, however, also within the scope of the present invention. For example, in one embodiment of the structure 10 of FIG. 1 or of FIG. 4, every other subcavity is filled with a first dielectric material and the remaining alternate subcavities are filled with a second dielectric material. In an embodiment of the structure 30 of FIG. 2, the top subcavities 46 can be filled with one dielectric, which can be air, and the bottom subcavities 44 can be filled with a different dielectric.

In one embodiment, a height of the electrode elements is greater than or equal to 0.05 microns.

In another embodiment, a height of the electrode elements is greater than or equal to 0.5 micros.

In still another embodiment, a height of the electrode elements is greater than or equal to 1 micron.

In yet another embodiment, a height of the electrode elements is greater than or equal to 2.5 microns.

In one embodiment, a height of the electrode elements is smaller than or equal to 5 microns.

In yet another embodiment, a height of the electrode elements is smaller than or equal to 3 microns.

Any combination of the above maximum and minimum height of the electrode elements of the present invention can be combined to form an appropriate range of electrode heights in an embodiment of the present invention.

In one embodiment, a separation between adjacent electrode elements is greater than or equal to 5 nanometers.

In another embodiment, a separation between adjacent electrode elements is greater than or equal to 50 nanometers.

In one embodiment, a separation between adjacent electrode elements is smaller than or equal to 1000 nanometers.

In another embodiment, a separation between adjacent electrode elements is smaller than or equal to 250 nanometers.

In still another embodiment, a separation between adjacent electrode elements is smaller than or equal to 25 nanometers.

Any combination of the above maximum and minimum separation between adjacent electrode elements of the present invention can be combined to form an appropriate range of separation between adjacent electrode elements in an embodiment of the present invention.

In one embodiment, a width of the at least one subcavity is greater than or equal to 5 nanometers (nm).

In another embodiment, a width of the at least one subcavity is greater than or equal to 250 nanometers.

In still another embodiment, a width of the at least one subcavity is greater than or equal to 500 nanometers.

In one embodiment, a width of the at least one subcavity is greater than or equal to 1000 nanometers.

In another embodiment, a width of the at least one subcavity is greater than or equal to 800 nanometers.

In one embodiment, a width of the at least one subcavity is greater than or equal to 600 nanometers.

Any combination of the above maximum and minimum width of the at least one subcavity of the present invention can be combined to form an appropriate range of widths in an embodiment of the present invention.

In one embodiment, a total width of each of the plurality of electrode elements of the present invention is greater than or equal to 50 nanometers (nm).

In another embodiment, a total width of each of the plurality of electrode elements is greater than or equal to 300 nm.

In still another embodiment, a total width of each of the plurality of electrode elements is greater than or equal to 500 nm.

In one embodiment, a total width of each of the plurality of electrode elements is less than or equal to 2000 nm.

In another embodiment, a total width of each of the plurality of electrode elements is less than or equal to 1200 nm.

In yet another embodiment, a total width of each of the plurality of electrode elements is less than or equal to 750 nm.

Any combination of the above maximum and minimum total width of each of the plurality of electrode elements can be combined to form an appropriate range in an embodiment of the present invention.

The thickness (see 106, FIG. 6A; 126, FIG. 7A; 184, FIG. 9) of each of the side walls of the electrode shell of any of the embodiments of the present invention can be dimensioned to be about 5% to 90% of the width 23 of the entire electrode element 12, e.g. FIG. 1.

In one embodiment, the thickness of the walls of the electrode shell of the present invention are greater than 25 nm.

In another embodiment, the thickness of the walls of the electrode shell of the present invention are greater than 100 nm.

In still another embodiment, the thickness of the walls of the electrode shell of the present invention are greater than 250 nm.

In yet another embodiment, the thickness of the walls of the electrode shell of the present invention are greater than 500 nm.

In an additional embodiment, the thickness of the walls of the electrode shell of the present invention are greater than 1000 nm.

In one embodiment, the thickness of the walls of the electrode shell of the present invention are less than 1800 nm.

In another embodiment, the thickness of the walls of the electrode shell of the present invention are less than 1500 nm.

In still another embodiment, the thickness of the walls of the electrode shell of the present invention are less than 1200 nm.

Any combination of the above maximum and minimum thickness of the walls of the electrode shell can be combined to form an appropriate range of thickness of the walls of the electrode shell in an embodiment of the present invention.

One skilled in the art will appreciate that the particular pattern of the grating structure of the present invention, including the width(s) of the grooves, the height(s) of the electrode elements, and the pattern and types of dielectric materials chosen can be tailored to the desired optoelectronic application, as described in D. Crouse, "Numerical Modeling of Electromagnetic Resonance Modes in Complex Grating Structures and Optoelectronic Device Applications," IEEE Trans. Electron Devices Vol. 52, pp. 2365-2373 (2005), (hereinafter, the "*Modeling*" reference), and in D. Crouse, et al., "The Role of Optical and Surface Plasmon Modes in Enhanced Transmission and Applications," *Optics Express*. Vol. 13, pp. 7760-7771 (October 2005), (hereinafter, the "*Applications*" reference), which are both incorporated herein by reference.

Referring back to FIG. 1, a large portion of the incident light, of both TM and TE polarizations, is efficiently transmitted through the grooves 18 to the other side of the grating structure 10, where it is channeled into the substrate 22. Consequently, the spacing between the electrode elements 12 can be reduced to improve the speed of the device 20, without significantly, reducing the responsivity of the device, as described in co-owned PCT Application No. PCT/US2005/009383 to Crouse, et al., published as WO 2005/092037, which is incorporated herein by reference.

It should be understood, however, that an optoelectronic device incorporating the grating structure of the present invention is not limited to MSM photodetectors. The grating structure of the present invention concentrates incident light or optical energy within the subcavities. Accordingly, each subcavity essentially serves as a holding cell or collector for the optical energy, which can be both concentrated and amplified in the subcavity as it waits to serve another purpose or function. Because the light channeled through the grooves increases as the intensity of the light near its entrance increases, enhanced transmission is achieved by concentrating/localizing the incident light in the subcavities. Also, the light energy which is concentrated in the subcavities can be temporarily held there and then allowed to channel into and/or through the grooves, for example, by applying a potential difference between adjacent electrode elements.

Accordingly, the structure may be incorporated into a variety of different optoelectronic devices to harness and concentrate light near a material or component which is placed in the grooves between the electrode elements. Various materials or components can be placed in the grooves to tailor a device to perform a particular function that would benefit from the resultant increased amount of optical energy. If no such component is placed in the grooves, the device is simply an optical transmission grating, with the subcavities functioning to enhance light transmission, preferably within a predetermined wavelength range or bandwidth.

By placing IR emitting quantum wires 41 in the grooves (FIG. 1), the concentration of optical energy in the subcavities is used to excite the quantum wires for more efficient IR emission.

In yet another embodiment, biosensors 43 (FIG. 2) can be placed in the grooves to more efficiently luminesce when the incident optical radiation is increased due to the spill-over of concentrated optical energy from the subcavities. Such biosensors can include DNA sensors, chemical sensors, and biological sensors.

In still another embodiment, the substrate, and preferably, material 45 (FIG. 2) added between the grooves, is formed from a light emitting material used in forming a light emitting diode (LED) in order to form a more efficient LED. The structure enhances the outcoupling of light from the LED.

In the particular embodiment of the structure 10 shown in FIG. 1, the electrode shell 16 forms a cap over the subcavity 14, so that in the cross-section shown, three sides of the subcavity 14 are lied with the electrode shell 16, and one side borders the substrate 22. As described above and the Applications reference, this particular configuration was shown by the present inventors to eliminate undesirable horizontal surface plasmons (HSPs) that otherwise form at the metal/semiconductor interface of conventional MSM detectors which incorporate classical electrode grating structures.

Referring to FIG. 2, another embodiment of a grating structure 30 of the present invention includes a plurality of electrode elements 32, preferably arranged in a regular pattern. Each electrode element 32 includes two subcavities 34 and an electrode shell 36 that partially surrounds the subcavities 34. Adjacent electrode elements 32 are separated by grooves 38. Each subcavity 34 is filled with either a dielectric or a semiconductor.

One embodiment of an optoelectronic device 40 includes the grating structure 30 superposed on a semiconductor substrate 42 to form an MSM photodetector.

Figure 3:
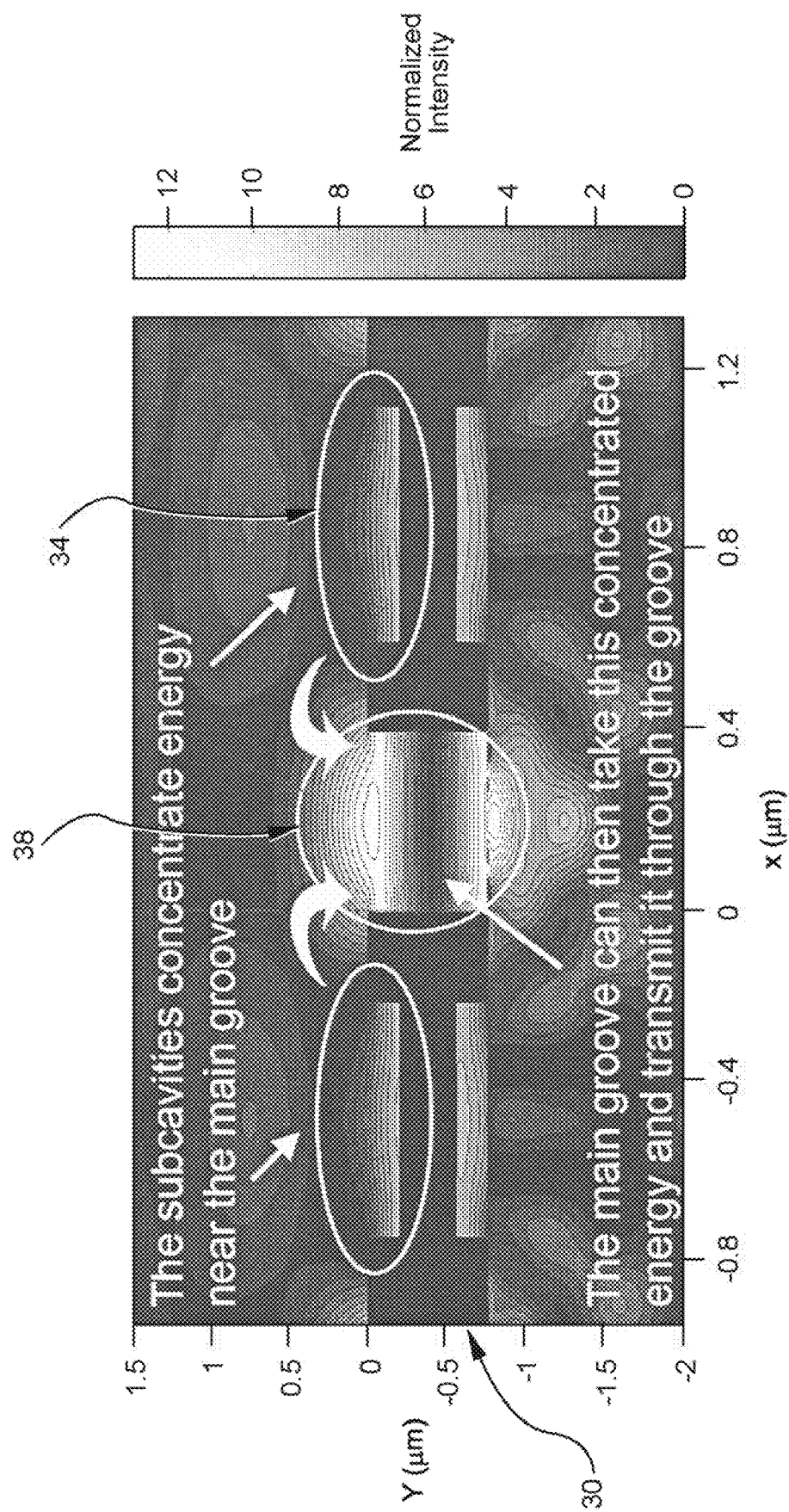
FIG. 3 is a plot of a magnetic field profile of optical radiation incident on the light-channeling and concentrating electrode structure of FIG. 2, showing the concentration of optical energy in the subcavities and grooves.

As shown in FIG. 3 for the embodiment of FIG. 2, the grating structures 30 of the present invention concentrate incident energy in the subcavities 34, which can then be transmitted through the grooves 38 for various applications as described above.

The cross-section of the electrode shell 36 of FIG. 2 through either direction is in the shape of an "H" with dielectric material filling the subcavities 34 formed on the top and bottom of the electrode element 32. Accordingly, each electrode element 32 can be described as an electrode or contact, preferably metallic, with notches (subcavities) formed in the top and bottom of the contacts. The subcavities 34 preferably include a bottom subcavity 44 and a top subcavity 46.

Similar to the structure 10 of FIG. 1, the bottom notch or subcavity 44 of FIG. 2 leaves only a small portion of the surface of the electrode shell 36 in contact with the substrate 42. One skilled in the art will appreciate that it is possible to form a partial metallic coat on the outer walls 47 of the embodiment of FIG. 1, for example, that does not extend all the way down to contact the substrate. In the present invention, however, the outer walls 47 of the embodiment of FIG. 1, and 49 of FIG. 4 preferably contact the substrates 22 and 42, respectively, and also preferably, approximate a rectangular profile as shown.

Referring again to FIG. 2, since only this small portion of the electrode shell 36 contacts the substrate 42, the presence of the bottom subcavity 44 strongly inhibits formation of HSPs at the interface 48 between the substrate 42 and the electrode elements 32 while leaving the WRs relatively unaffected. Similarly, the top subcavity 46 strongly inhibits the formation of HSPs at the top surface of the electrode element 32, i.e., between the electrode shell 36/air interface.

The presence of the upper subcavity 46 and the electrode shell geometry shown in FIG. 2 also introduces additional cavity modes (CM) that have useful optical effects, as discussed further below.

Figure 4:
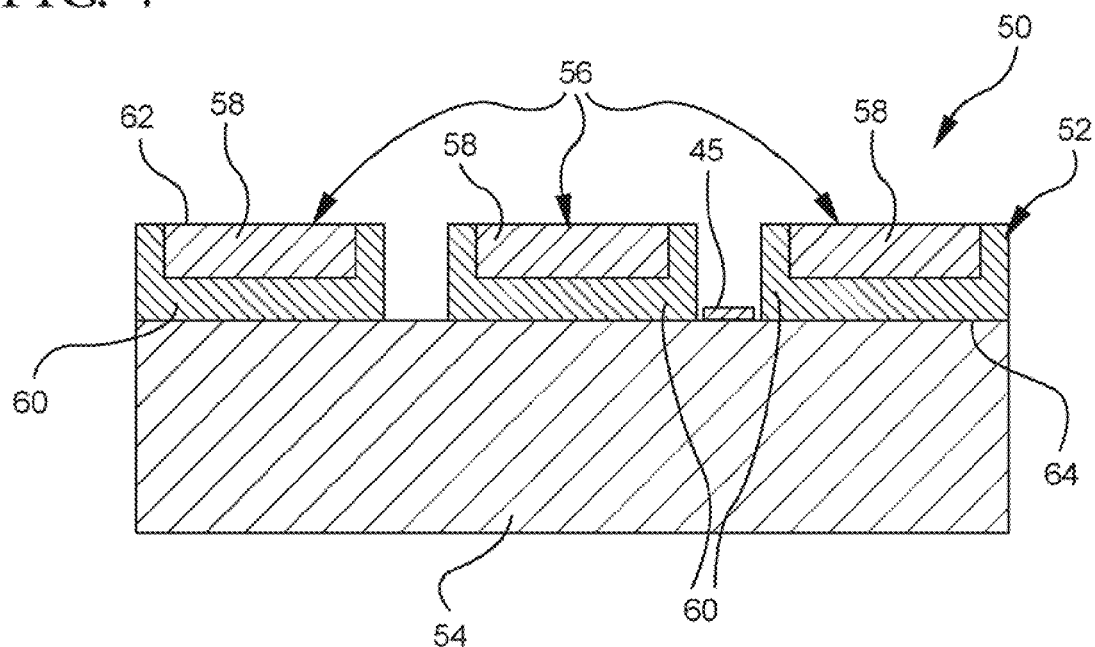
FIG. 4 is a pictorial representation of a cross-section through a portion of yet another embodiment of a light-channeling and concentrating structure and MSM detector in accordance with the present invention.

Referring to FIG. 4, another embodiment of an optoelectronic device 50 of the present invention includes a grating structure 52 for concentrating or localizing a portion of incident electromagnetic radiation (light energy, e.g.) superposed on a substrate 54. The electrode structure 52 includes a plurality of electrode elements 56, preferably arranged in a regular pattern. Each electrode element 56 includes one subcavity 58 and an electrode shell 60, preferably metallic, that surrounds the subcavity 58 on three sides in the cross-section shown, including the side adjacent the substrate 54. Accordingly, as shown if FIG. 4, in a cross-section in either direction through the structure 52, the electrode shell 60 is preferably U-shaped. Each subcavity 58 is filled with a dielectric or semiconductive material. A top surface 62 of each electrode element 56 is substantially parallel to the surface of the substrate 54.

Only a small portion of the top surface 62 forms an interface between the metallic electrode shell 60 and air. Accordingly, HSPs that would otherwise form on an air/contact interface are largely eliminated from the structure 52 of FIG. 4, although HSPs will still form at the interface 64 between the substrate 54 and the metallic electrode shell 60.

Figure 5:
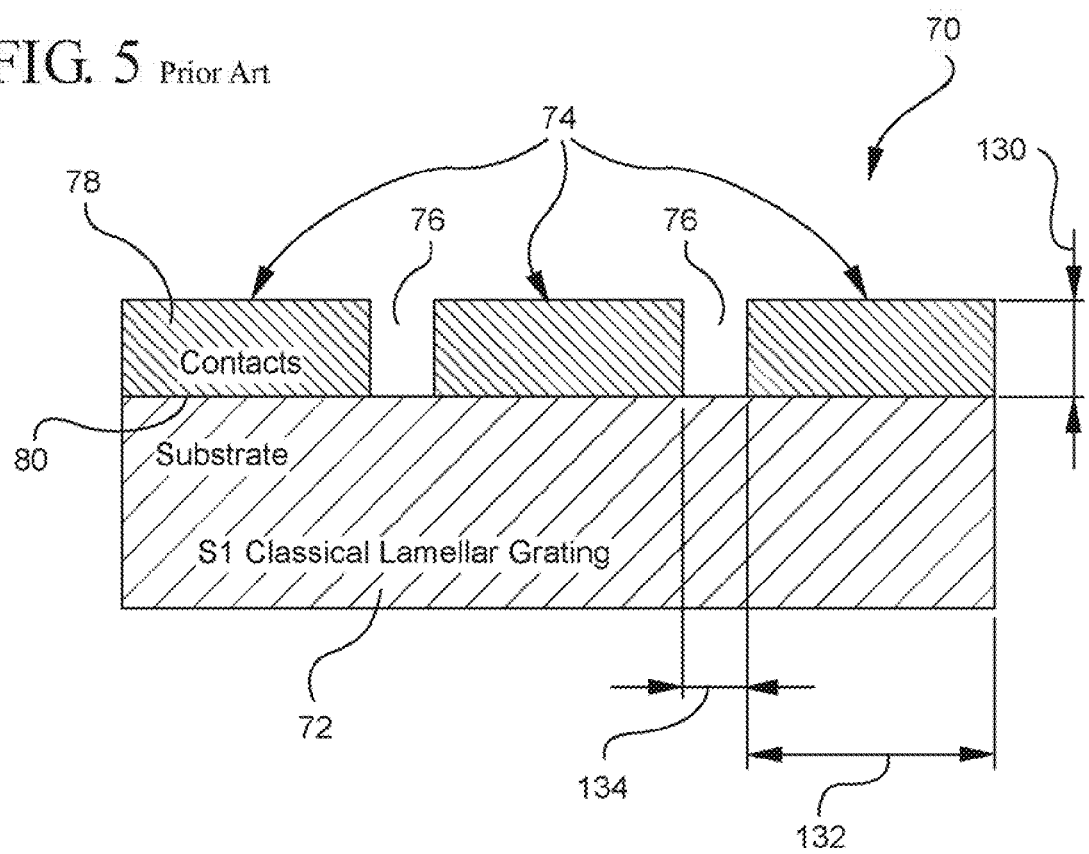
FIG. 5 is a pictorial representation of a cross-section through a conventional prior art electrode grating structure.

Referring to FIG. 5, in contrast to the electrode structures of the present invention, a classical lamellar electrode structure 70 superposed on a semiconductor substrate 72 includes low-profile solid rectangular box-shaped contacts 74 separated by grooves 76 of equivalent dimensions. HSPs are formed at both the upper air-contact interface 78 and at the lower contact-substrate interface 80.

There are many conventional optoelectronic devices that use the periodic arrangement of metallic contact shown in FIG. 5, which resembles a lamellar grating. In lamellar grating-like structures, HSP modes usually have energies and in-plane momentum that are very close to desirable WRs and the onset of diffraction modes; these two modes occur in pairs, i.e., HSP/WR pairs. Consequently, a WR is often confused with a HSP. However, the two modes have several important differences that can be exploited to optimize an optoelectronic device incorporating and electrode grating-like structure, such as: 1) HSPs have more electromagnetic field intensity within the lossy metal contacts; 2) HSPs only exist at the interface between a metal and a dielectric (or semiconductor); and 3) HSPs are more affected by perturbations in the periodicity and surfaces of the structure.

These differences can be used to selectively eliminate or minimize the role of HSPs while leaving diffracted modes, WRs, and CMs unchanged. In particular, the fact that HSPs only exist at a metal/dielectric or metal/semiconductor interface is used in the present invention to selectively "turn off" certain HSP modes while leaving WR modes relatively unaffected.

Referring to FIGS. 6A through 7B, this effect wash shown in an analysis performed to compare the HSP modes formed in the electrode structures represented in FIGS. 1 and 4 with those formed in the conventional structure 70 shown in FIG. 5.

Figure 6A:
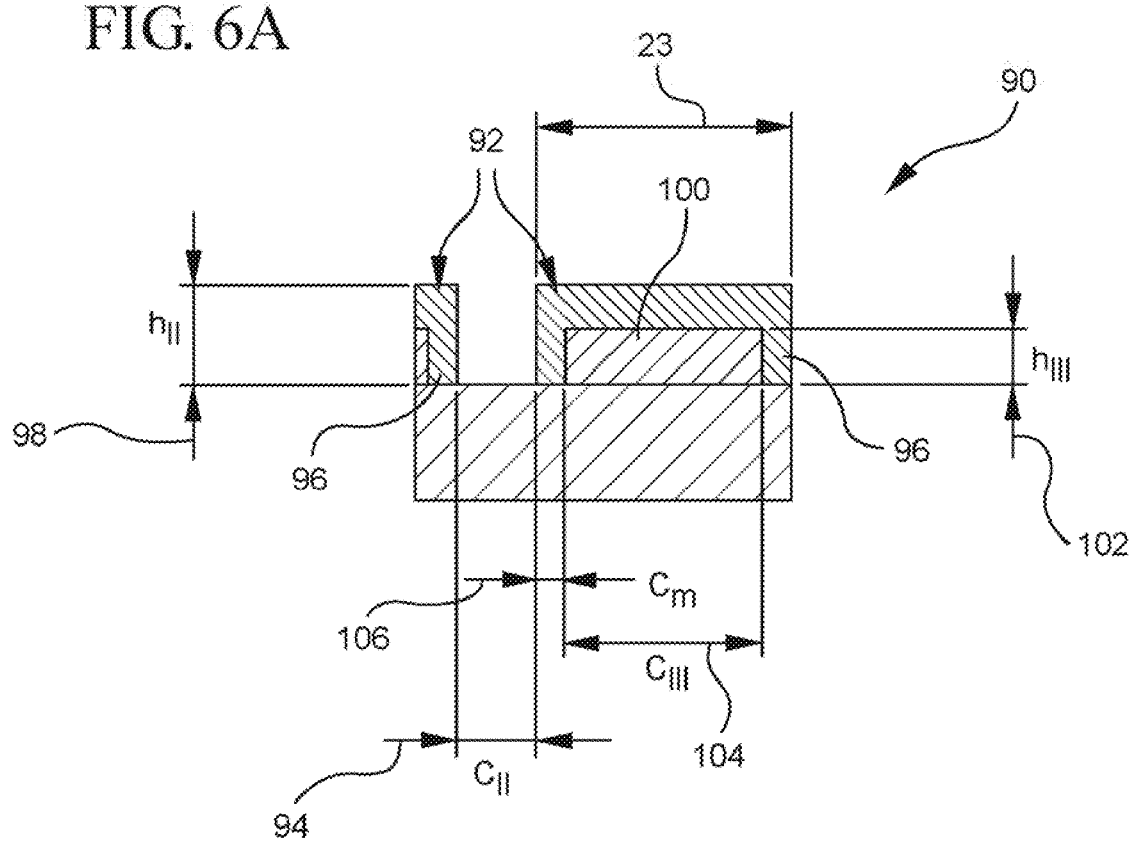
FIG. 6 is a pictorial representation of a cross-section through a portion of a particular embodiment of the electrode structure of FIG. 1.
FIG. 6B is a plot of the transmittance of incident radiation as a function of energy through the electrode structure shown in FIG. 6A.

In particular, referring to FIG. 6A, another embodiment of an electrode structure 90 of the present invention includes a plurality of electrode elements 92 spaced a distance 94 ($C_n$) apart from each other. Each element 92 includes an electrode shell 96 and has a height 98 ($h_n$). Each element 92 also includes a subcavity 100 or notch in the bottom of the electrode shell 96. Accordingly, the subcavity 100 is characterized by a thickness 102 ($h_m$) and a width 104 ($C_m$), and a side wall of the electrode shell 96 has a width 106 ($C_m$).

Figure 7A:
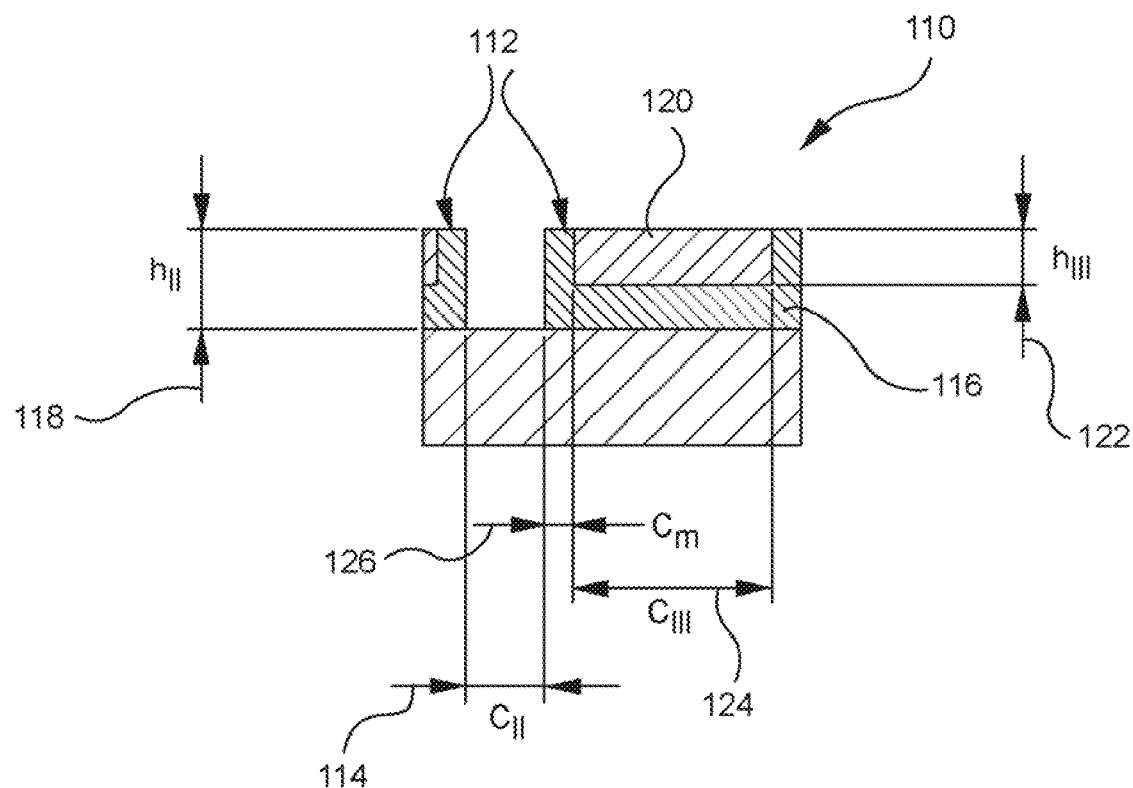
FIG. 7A is a pictorial representation of a cross-section through a portion of a particular embodiment of the electrode structure of FIG. 4.

Referring to FIG. 7A, yet another embodiment of an electrode structure 110 of the present invention includes a plurality of electrode elements 112 spaced a distance 114 ($C_n$) apart from each other. Each element 112 includes an electrode shell 116 and has a height 118 ($h_n$). Each element 112 also includes a subcavity 120 or notch in the top of the electrode shell 116. Accordingly, the subcavity 120 is characterized by a thickness 122 ($h_m$) and a width 124 ($C_m$). A side wall of the electrode shell 116 has a width 126 ($C_m$).

Figure 6B:
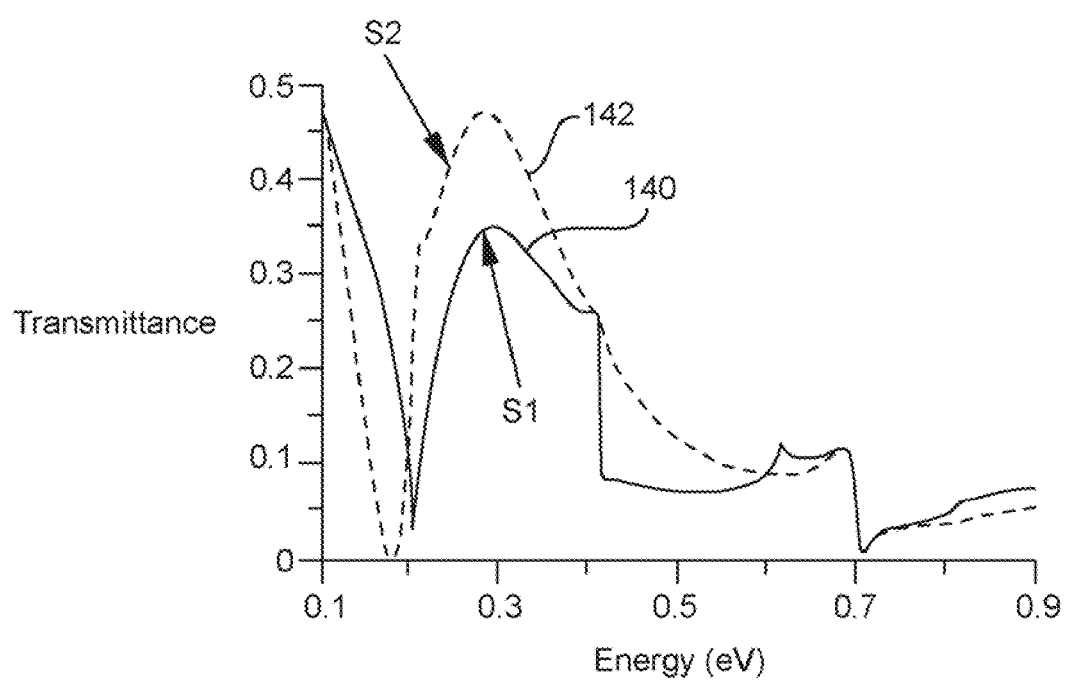
Figure 7B:
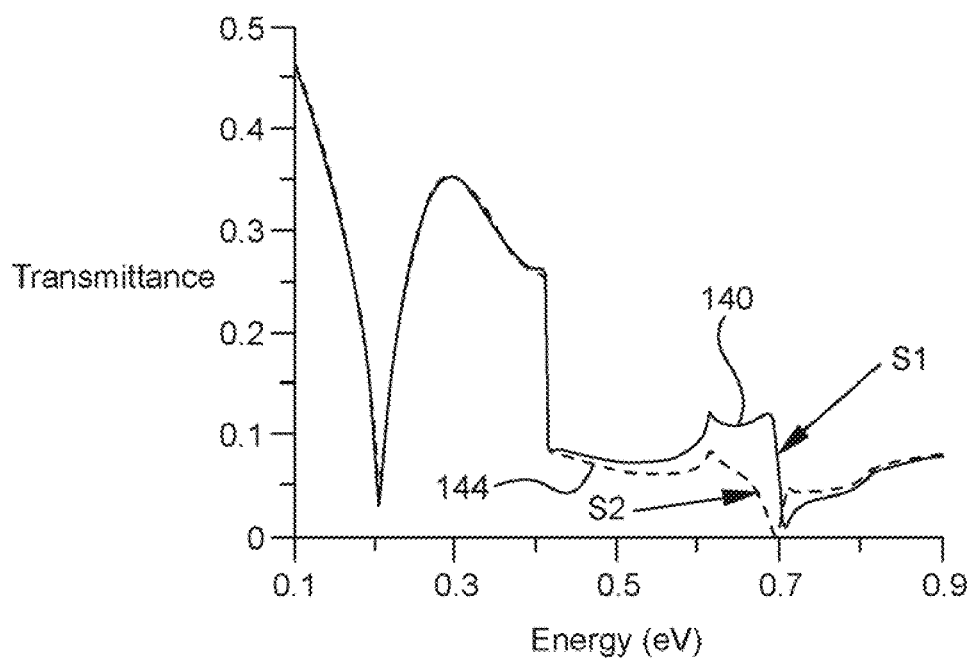
FIG. 7B is a plot of the transmittance of normally incident radiation as a function of energy through the electrode structure shown in FIG. 7A.

Referring to FIGS. 6B and 7B, a comparison of the HSP modes formed in the classical grating 70 of FIG. 5 to the HSP modes formed in the electrode structures 90 and 110 of FIGS. 6A and 7A, respectively, was conducted. For the analysis, the classical structure 70 with a gold electrode contact was used. The contact 78 was 0.96 μm in height 130, and 1.14 μm in width 132. The separation 134 between the contacts 78 was 0.61 ηm.

Referring to both FIGS. 6A and 7A, for comparison to the conventional structure 70, the electrode shells 96 of FIG. 6A and 116 of FIG. 7A were also gold, with electrode heights 98 and 118 $h_n$=0.96 μm. The separations 94 and 114 between contacts in both cases were 0.61 μm. In addition, the total width of the electrode elements 92 and 112 were also 1.14 μm, with the thickness 106 and 126 of each side wall equal to 0.2 μm and widths 104 and 124 of the subcavities 100 and 120 equal to 0.74 μm. In both FIGS. 6A and 7A, the subcavities were 0.2 μm thick and filled with silicon dioxide ($SiO_2$). The $SiO_2$ is assumed to have a frequency independent dielectric constant $\in$=2. For purposes of the analysis, the substrate for each of the structures in FIGS. 5, 6A, and 7B was silicon.

One skilled in the art will appreciate that the electromagnetic (EM) fields in the structures can be derived in pseudo-Fourier expansion according to Floquet's theorem. Accordingly, the EM fields inside the grooves and inside the notches or subcavities of the structures formed in accordance with the present invention can be expressed as a linear combination of orthonormal modes.

FIG. 6B shows the transmittance 140 for a normal incidence, TM-polarized input plane wave incident on the classical grating structure 70 and the transmittance 142 for a normal incidence, TM-polarized input plane wave incident on structure 90. A comparison of the two transmission curves shows that the major effect of the subcavity 100 in the structure 90 is the elimination of the HSP modes associated with the bottom metal/substrate interface 80 associated with the conventional structure 70. In particular, the HSP-produced transmittance minima at energies 0.21 eV and 0.42 eV in the transmittance curve 140 for the conventional structure 70 are eliminated in the transmittance curve 142 corresponding to the structure 90. In addition, the top air/contact HSP at 0.69 eV appears to be unaffected by the small notches in the structure. Finally, the transmittance peak at 0.62 eV in curve 140 is absent in the transmittance curve 142 for the structure 90 of FIG. 6A, which strongly suggests that the contact/Si (substrate) HSP mode at 0.62 eV produced a weakly enhanced transmission.

FIG. 7B shows a comparison of the transmittance 140 for a normal incidence. TM-polarized input plane wave incident on the classical grating structure 70 with the transmittance 144 for a normal incidence, TM-polarized input plane wave incident on structure 110. The major effect of the top subcavity 120 in the structure 110 of FIG. 7A on the transmittance 144 was the elimination of the HSP modes associated with the top metal/air interface of the conventional structure 70. In particular, FIG. 7B shows that the HSP-produced transmittance maximum at 0.62 eV is eliminated. The bottom Si/contact HSPs are unaffected by the top notches or subcavities 120 in the structure 110. It was shown by analysis, therefore, that in the structures of the present invention, HSPs can both enhance and inhibit transmission.

One skilled in the art will appreciate that there are many optoelectronic devices that can be developed or improved using the electrode structures formed in accordance with the present invention. These applications include, but are not limited to, the practical development of high bandwidth and high responsivity metal-semiconductor-metal photodetectors (MSM-PD), grating couplers in GaAs quantum well infrared photodetectors (QWIPs), and chemical and biological sensors to name a few. Two examples of these applications are described herein below. It should be appreciated, however, that the scope of the invention is by no means limited to these two examples.

In a first example, the electrode structures of the present invention are used to improve biological and chemical sensors. Surface plasmons (SP) are known for use in the past to fabricate such sensors. The conventional SP biological or chemical sensor is a flat metal film in a so-called Kretschmann configuration, as described, for example, in H. Kano, et al., "Surface-Plasmon Sensor for Absorption-Sensitivity Enhancement," *Appl. Opt.* 33, pp. 5166-5170 (1994). In this configuration, energy of the SP resonance is measured as the top of the metal film is exposed to the fluid that is to be analyzed for the presence of the chemical. If the chemical absorbs on the surface of the metal film it will change the local index of refraction and change the energy of the SP resonance.

Figure 8A:
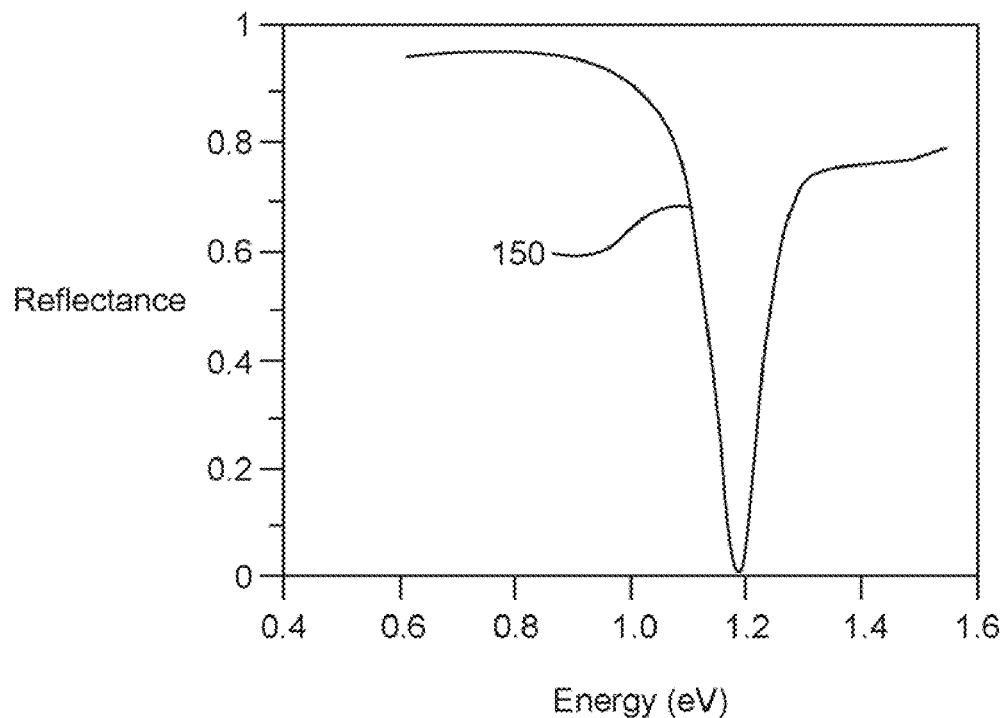
FIG. 8A is a plot of the reflectance of normally incident TM polarized radiation as a function of energy from the conventional grating structure of FIG. 5.

Another configuration for this type of device can use the conventional grating structure 70 shown in FIG. 5, but which has a high aspect ratio of approximately 10:1 for the grooves in aluminum. For example, the aluminum contacts may be 500 nm deep and 50 nm wide, with a 500 nm pitch. With this high aspect ratio, the CMs can produce narrow and dramatic resonant dips in the reflectance. For example, FIG. 8A shows the reflectance 150 for a TM polarized normal incidence beam and the dramatic reflection dip caused by the CM mode.

Figure 8B:
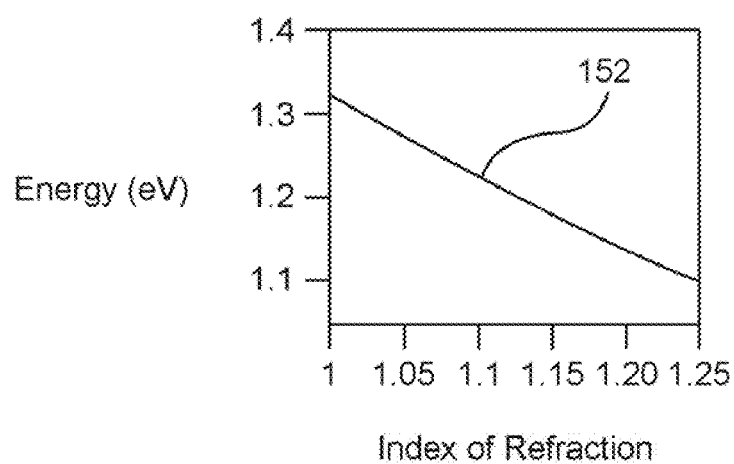
FIG. 8B is an exemplary plot of the dependence of the index of refraction of a material on the energy of the incident radiation.

For chemical and biological sensors, the index of refraction can be expected to be in the range of 1 to 1.25. In FIG. 8B, a plot of the dependence of the index of refraction 152 of a material on the energy of the incident radiation is shown. Accordingly, one skilled in the art will appreciate that the energy or wavelength of the resonance changes as the index of refraction in the grooves is increased from 1 to 1.25. In particular, there is almost a 0.21 eV (i.e., 200 nm) shift in the sharp reflectance minimum corresponding to the 0.25 increase in index of refraction, thereby allowing for high-resolution detectors that exploit the resonance dip. The present structure can exploit this resonance dip and thus form miniaturized microfuidic devices. In such devices, the grooves form channels that need only microliters of samples for successful testing.

The electrode structures of the present invention can also be used for the development of high bandwidth and high responsivity MSM-PDs, and offer several advantages over the conventional MSM configurations. As described above, the structures 10 (FIG. 1) and 30 (FIG. 2) inhibit the formation of undesirable HSPs at the metal/semiconductor interface that have been shown to produce large absorption in conventional metal contacts or wires, peaks in the reflectance curve, and high field intensities in the semiconductor directly under the contact (where the static field produced by an applied bias is small).

The structures of the present invention which eliminate HSPs can also be tailored to selectively control, minimize, combine, and/or maximize horizontal surface plasmon (HSP) modes, Wood-Rayleigh (WR) modes, and cavity modes (CM). Accordingly, the structures can control the distribution of light into various propagating transmitted modes into various substrate materials, depending on the particular application. As provided above, methods for tailoring electrode grating structures to control the distribution of light in the substrate are disclosed and described in detail in the Modeling and the Applications references.

In one embodiment, the semiconductor is a direct bandgap material with a large absorption constant, such as $In_{0.53}Ga_{0.43}As$. This semiconductor is useful in optoelectronic devices for telecommunication applications, particularly in the wavelength range of about 1.33 μm to 1.5 μm.

For a variety of applications in the visible and near IR spectral range (e.g., imaging, 850 nm wireless or very short range (VSR) fiber-based communication systems, or single photon counting device), an indirect bandgap semiconductor with a small absorption constant, such as silicon (Si), can be used as the substrate. For Si, a high zero-order transmitted wave is undesirable because this component would propagnate tens of microns into the Si and would greatly decrease the bandwidth of the device. Hence for a Si substrate, the excited cavity modes (CM) preferably transfer all the energy into higher diffracted orders that travel as parallel to the semiconductor/metal interface as possible, as also described in the Modeling and Applications references.

Since the structures 10 and 30 eliminate the dips associated with HSPs, the Cm mode around a particular energy location is broadened. A broad and enhanced CM mode is advantageous from a design point of view for an MSM-PD as the light shining from a fiber has wavelengths in and around the energy locations for which the device is designed.

For other applications, the substrate of an MSM-PD can include direct bandgap semiconductors, such as InGaAs. For these devices, the responsivity is dependent on the total amount of light transmitted into the substrate. In particular, the high absorbance causes all the light to be absorbed within the top few microns of the substrate. In addition, the reponsivity is fairly independent of how this total energy is distributed among the zero-order and higher order propagating modes. Accordingly, the bandwidth is less dependent on the distribution of energy among the zero-order and higher order propagating modes in the substrate and more dependent on contact spacing than, for example, the Si MSM-PD.

Figure 9:
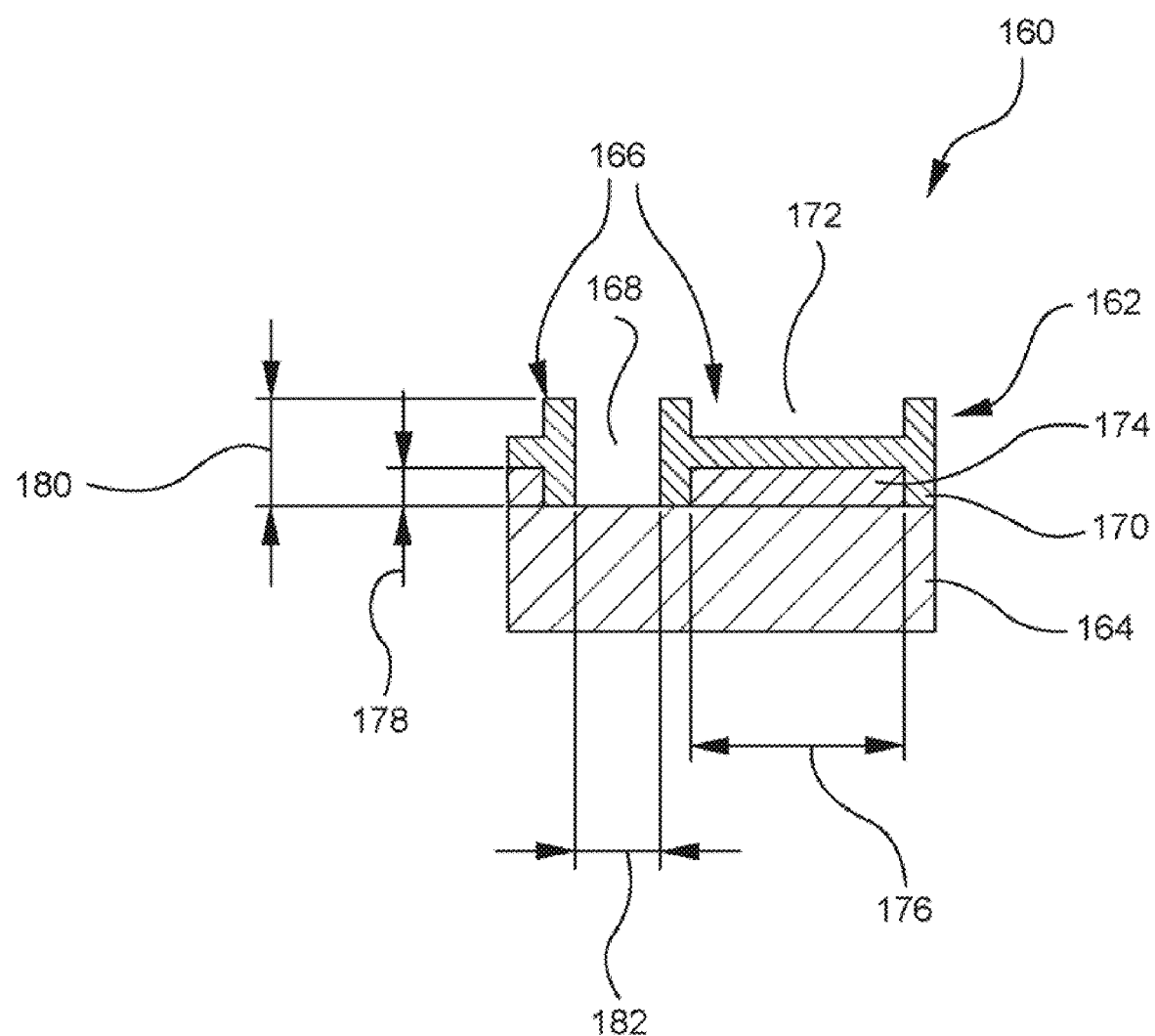
FIG. 9 is a pictorial representation of a cross-section through a portion of a particular embodiment of the electrode structure of FIG. 2.

Referring to FIG. 9, in an exemplary embodiment of the structure 30 of FIG. 2, and MSM-PD 160 formed in accordance with the present invention includes a structure 162 superposed on a substrate 164 of InGaAs. The structure 162 includes a plurality of electrode elements 166, separated by grooves 168. Each element 166 includes an electrode shell 170 of gold (Au), which divides an partially surrounds an upper subcavity 172, which is occupied only by air, and a lower subcavity 174, which, like the substrate 164, is filled with InGaAs. Both upper 172 and lower 174 subcavities have a width 176 of 0.53 μm and a height 178 of 0.2 μm. In addition, the electrode elements 166 are 0.76 μm in height 180, and are separated by a distance 182 of 0.4 μm. Finally, the walls of the electrode shell 170 are 0.2 μm in thickness 184, so that the pitch of the structure is d=1.33 μm.

As described briefly above, the top 46, 172 and bottom 44, 174 and bottom 44, 174 subcavities serve different purposes and are independent of each other. The excitation of a Fabry-Perot resonance in the top subcavity 46, 172 facilitates the collection of incident light from the air region and the channeling of the light through the grooves 38, 168 and into the substrate 42, 164. The additional Fabry-Perot (FP) resonance associated with top subcavity 46, 172 would otherwise not exist for a classical grating 70 (FIG. 5). For this particular structure, the FP resonance occurs at an energy location slightly less than the first WR mode for the air/metal interface (these two modes are independent of each other).

In addition, the top subcavity 46, 172 eliminates the top air/contact HSP, and the bottom subcavity 44, 174 eliminates the bottom contact/substrate HSPs that may be surrounding the energy value of interest.

To analyze the effect of the two-cavity 150 of FIG. 9, the reflectance and transmittance of a conventional structure 70 of FIG. 5 was compared to that of the two-cavity structure 160. The conventional structure 70 studied was also formed with gold contacts superposed on an InGaAs substrate. Consistent with the structure 160 of FIG. 9, the spacing 134 between the contacts 78 of the conventional structure 70 was 0.4 μm, and the height 130 and width 132 of the contacts 78 were 0.76 μm and 0.93 μm respectively.

Figure 10A:
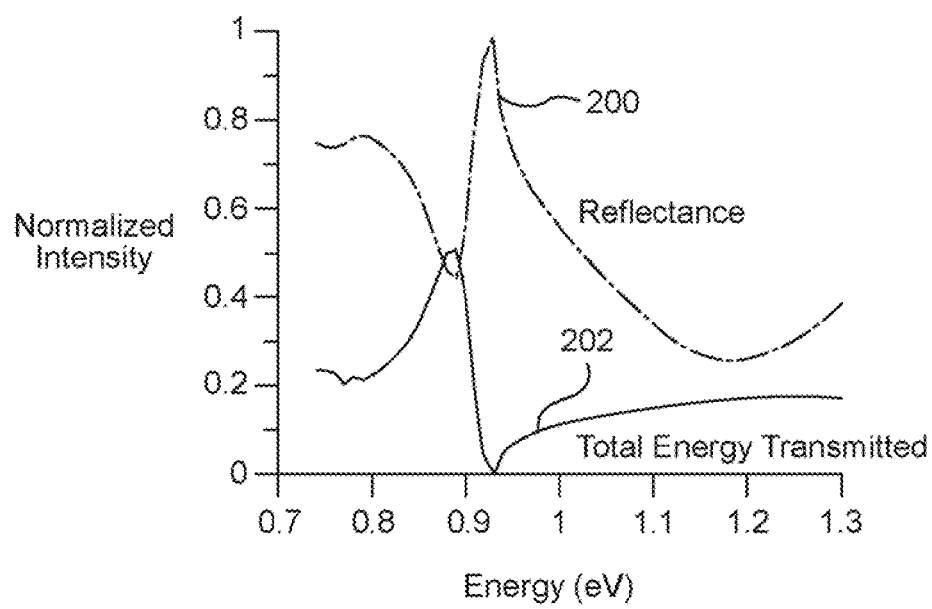
FIG. 10A is a plot of the reflectance and transmittance of normally incident radiation on the conventional electrode structure of FIG. 5.
Figure 10B:
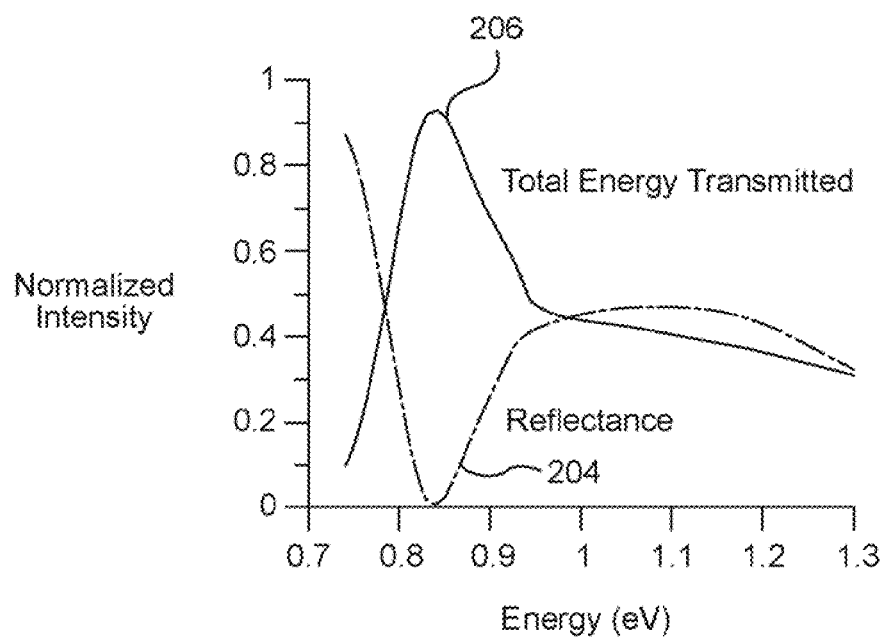
FIG. 10B is a plot of the reflectance and transmittance of normally incident radiation on the electrode structure of FIG. 9.

FIG. 10A shows a plot of the reflectance 200 and total intensity 202 of light transmitted into the substrate 72 of the conventional device shown in FIG. 5. A resonant HSP/WR pair is clearly seen at 0.93 eV. Referring to FIG. 10B, a plot of the reflectance 204 and total energy transmitted 206 for the InGaAs MCM-PD 160 of FIG. 9 clearly shows that a broad peak in the total transmission 202 was achieved using the additional Fabry-Perot resonance associated with the top subcavity 172. In addition, the top HSP located at 0.93 eV in FIG. 10A was eliminated. In the particular energy range studied, the bottom HSP does not exist for the given structural dimensions. Nevertheless, it is believed that the bottom subcavity is helpful in avoiding it if it exists for a different structural geometry.

Figure 11:
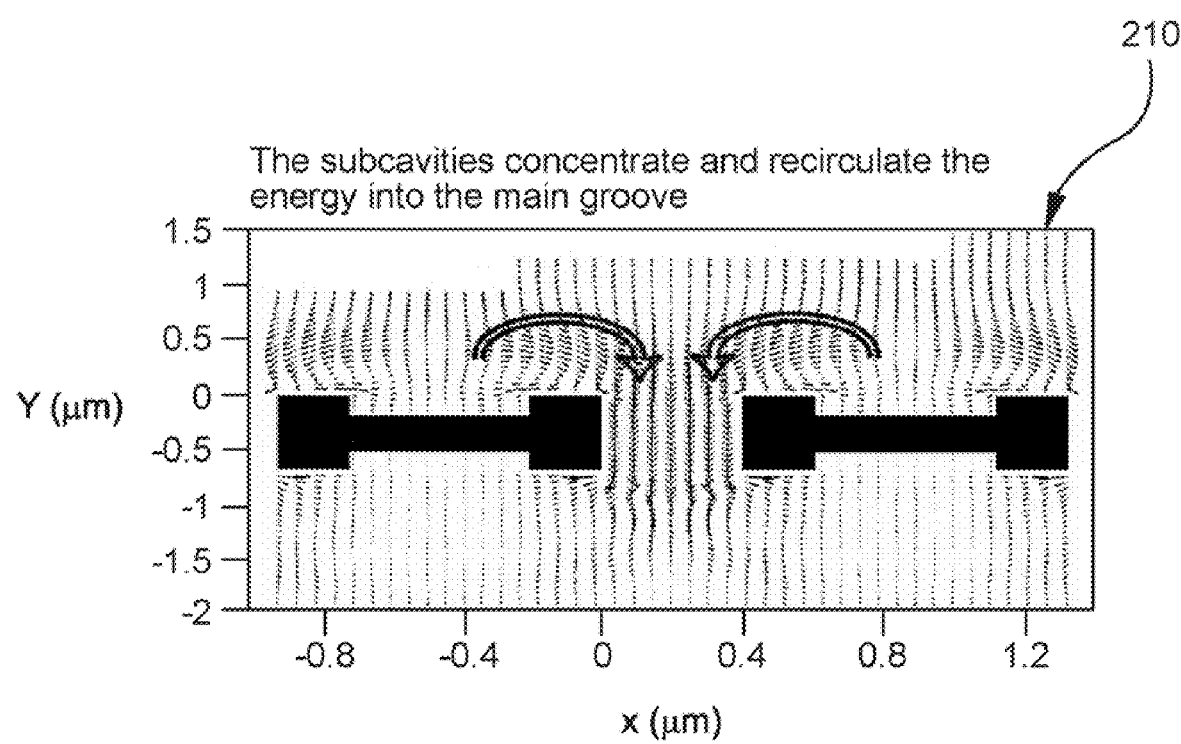
FIG. 11 is a plot of the Poynting vector for the electrode structure of FIG. 9.

FIG. 3 shows the magnetic field intensity and FIG. 11 shows a plot of the Poynting vector 210 for the InGaAs MSM-PD 0.84 eV (1.47 μm) for the dimensions mentioned above. There is strong localization of light right under the window opening and very little field under the contracts and in the substrate region, which is ideal for the enhancing the performance of the MSM-PD. The Poynting vector 210 shows the excitation of top subcavity resonance and how it concentrates the energy of the incident beam within the subcavities and the subsequent channeling of the energy through the main groove and into the substrate. An efficiency of 93% was obtained for the percentage of the total energy of the incident beam that is transmitted into the substrate. This is a large percentage considering the fact that approximately 70% of the surface of the InGaAs is covered with thick metallic contacts.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An optoelectronic device for concentrating and channeling at least a portion of incident electromagnetic radiation comprising:

a substrate; and an electrode structure in superposed relationship with said substrate;

said electrode structure comprising:

a plurality of electrode elements arranged in a substantially regular pattern, wherein each electrode element comprises at least one subcavity filled with one of a dielectric and a semiconductive material and an electrode shell at least partially surrounding said at least one subcavity, said plurality of electrode elements having a potential difference between adjacent electrode elements; and a plurality of grooves between adjacent electrode elements, whereby said electrode structure initially concentrates at least a portion of the incident electromagnetic radiation in said at least one subcavity and channels said portion of the incident electromagnetic radiation into said plurality of grooves.

2. The optoelectronic device of claim 1, wherein said electrode shell forms a cap over said at least one subcavity, said at least one subcavity having one side proximate said substrate and at least three sides proximate said electrode shell.

3. The optoelectronic device of claim 1, wherein said one of said dielectric and said semiconductive material comprises one of silicon dioxide, silicon nitride, and polyimide.

4. The optoelectronic device of claim 1, further wherein a height of said plurality of electrode elements is in a range of 0.05 microns to 5.0 microns.

5. The optoelectronic device of claim 1, further wherein a separation between adjacent electrode elements is in a range of 5 nanometers to 1000 nanometers.

6. The optoelectronic device of claim 1, further wherein a width of said at least one subcavity is in a range of 5 nanometers to 1000 nanometers.

7. The optoelectronic device of claim 1, further wherein a total width of each of said plurality of electrode elements is in a range of 50 nanometers to 2000 nanometers.

8. The optoelectronic device of claim 1, wherein said electrode shell comprises a metal.

9. The optoelectronic device of claim 8, wherein said electrode shell comprises one of gold, aluminum, and copper.

10. The optoelectronic device of claim 1, wherein said substrate comprises a semiconductive material.

11. The optoelectronic device of claim 10, wherein said semiconductive material comprises one of silicon, gallium arsenide, indium phosphide, aluminum gallium arsenide, indium gallium arsenide, and mercury cadmium telluride.

12. The optoelectronic device of claim 8, wherein said substrate comprises a silicon-on-insulator structure.

13. The optoelectronic device of claim 10, further comprising a sensor connected to said plurality of electrode elements for sensing an electrical quantity, wherein said device is adapted to detect at least said portion of the incident electromagnetic radiation.

14. The optoelectronic device of claim 1, further comprising at least one periodicity of said substantially regular pattern of said electrode elements associated with at least one predetermined wavelength range, wherein at least said portion of incident electromagnetic radiation includes electromagnetic radiation within said at least one predetermined wavelength range.

15. The optoelectronic device of claim 1, wherein said electrode shell comprises one side proximate both said substrate and a bottom surface of said at least one subcavity, said at least one subcavity comprising one subcavity surrounded on at least three sides by said electrode shell and an unbounded side forming a top surface which is substantially parallel to said substrate.

16. The optoelectronic device of claim 1, wherein said at least one subcavity comprises a top subcavity and a bottom subcavity separated by a central wall of said electrode shell, wherein said bottom subcavity comprises one side proximate said substrate and at least three sides proximate said electrode shell, and wherein said top subcavity comprises at least three sides proximate said electrode shell and an unbounded side forming a top surface which is substantially parallel to said substrate.

17. The optoelectronic device of claim 16, wherein said top subcavity is filled with one of a first dielectric and a first semiconductive material and said bottom subcavity is filled with one of a second dielectric and a second semiconductive material.

18. The optoelectronic device of claim 17, wherein said top subcavity is filled with air.

19. The optoelectronic device of claim 17, wherein at least one of said top subcavity and said bottom subcavity is filled with one of silicon, gallium arsenide, indium phosphide, aluminum gallium arsenide, indium gallium arsenide, and mercury cadmium telluride.

20. The optoelectronic device of claim 1, wherein said optoelectronic device is adapted to emit infrared radiation, said optoelectronic device further comprising infrared-emitting quantum wires in said plurality of grooves.

21. The optoelectronic device of claim 1, wherein said optoelectronic device is adapted to efficiently luminesce, said optoelectronic device further comprising biosensors positioned in said plurality of grooves.

22. The optoelectronic device of claim 1, wherein said plurality of electrode elements comprises positive voltage electrode shells alternately arranged with negative voltage electrode shells.

23. The optoelectronic device of claim 22, wherein said positive voltage is applied to every other shell and a negative voltage is applied to the remaining shells using an interdigitated electrode scheme.

* * * * *